United States Patent
Oiwa et al.

(10) Patent No.: US 7,177,622 B2
(45) Date of Patent: Feb. 13, 2007

(54) DIGITAL TUNER

(75) Inventors: Koji Oiwa, Sakai (JP); Kensuke Baba, Kawachinagano (JP)

(73) Assignee: Sharp Kabushiki Kaisha, Osaka (JP)

( * ) Notice: Subject to any disclaimer, the term of this patent is extended or adjusted under 35 U.S.C. 154(b) by 322 days.

(21) Appl. No.: 10/941,953

(22) Filed: Sep. 16, 2004

(65) Prior Publication Data
US 2005/0064843 A1 Mar. 24, 2005

(30) Foreign Application Priority Data
Sep. 19, 2003 (JP) ............................. 2003-327289

(51) Int. Cl.
H04B 1/16 (2006.01)
H04B 1/26 (2006.01)

(52) U.S. Cl. ...................... 455/340; 455/323

(58) Field of Classification Search ............... 455/340, 455/323, 73, 77, 552.1, 191.1, 191.3, 266, 455/289, 173.1, 255, 182.3, 339, 193.1, 307, 455/197.3; 375/335, 350, 316, 340, 147; 725/14, 15, 731
See application file for complete search history.

(56) References Cited

U.S. PATENT DOCUMENTS 6,968,173 B2 * 11/2005 Cowley ...................... 455/323
7,039,385 B1 * 5/2006 Hoffmann et al. .......... 455/340
7,065,337 B2 * 6/2006 Cowley et al. ............. 455/340

FOREIGN PATENT DOCUMENTS

JP 8-289221 A 11/1996
JP 9-232989 A 9/1997

* cited by examiner

*Primary Examiner*—Aung Moe
(74) *Attorney, Agent, or Firm*—Birch, Stewart, Kolasch & Birch, LLP

(57) ABSTRACT

A digital tuner of the invention has: a filter section that selects a desired reception signal from inputted reception signals; a converter section that performs frequency conversion on the desired reception signal selected by the filter section; a level monitor section that monitors, with respect to a signal based on the signal outputted from the filter section, the signal levels thereof at two or more frequencies within the reception band; and a waveform shaper section that varies the waveform inclination of signals based on the inputted reception signals within the reception band according to the results of monitoring by the level monitor section. This configuration helps reduce the waveform inclination of the output signal.

18 Claims, 10 Drawing Sheets

DIGITAL TUNER

This nonprovisional application claims priority under 35 U.S.C. § 119(a) on Patent Application No. 2003-327289 filed in Japan on Sep. 19, 2003, the entire contents of which are hereby incorporated by reference.

BACKGROUND OF THE INVENTION

1. Field of the Invention

The present invention relates to a digital tuner for receiving a digital signal.

2. Description of Related Art

As an example of a conventional digital tuner, a digital tuner for receiving a television broadcast will be described below. FIG. 15 shows an example of the configuration of a conventional digital tuner. The conventional digital tuner shown in FIG. 15 is provided with an RF input terminal 1, a band-pass filter (BPF) 2, an RF amplifier 3, a band-pass filter (BPF) 4, a tuning voltage generator circuit 5, a voltage-controlled oscillator (VCO) 6, a mixer 7, and an IF output terminal 9.

A number of reception signals are fed to the RF input terminal 1, and, of these reception signals, only the desired reception signal is selected by the band-pass filter 2, of which the filtering characteristics vary according to a tuning voltage outputted from the tuning voltage generator circuit 5. The desired reception signal selected by the band-pass filter 2 is then amplified by the RF amplifier 3. Thereafter, of the signals outputted from the RF amplifier 3, only the desired reception signal is further selected by the band-pass filter 4, of which the filtering characteristics vary according to the tuning voltage outputted from the tuning voltage generator circuit 5. The thus selected desired reception signal is then fed to the mixer 7. The mixer 7 also receives a local oscillation signal oscillated by the voltage-controlled oscillator 6. Here, the frequency of the local oscillation signal varies according to the tuning voltage outputted from the tuning voltage generator circuit 5. The mixer 7 performs frequency conversion by mixing the desired reception signal with the local oscillation signal so that the desired reception signal is down-converted into an intermediate-frequency (IF) signal, which is then outputted to the IF output terminal 9. The frequency of the intermediate-frequency signal is determined by the difference between the frequency of the local oscillation signal and that of the desired reception signal. The tuning voltage generator circuit 5 generates different tuning voltages for different reception channels. Thus, the frequency of the local oscillation signal is varied in proportion to that of the desired reception signal, so that the frequency of the intermediate-frequency signal outputted from the mixer 7 remains constant.

In this way, the conventional digital tuner shown in FIG. 15 selects one from a number of reception signals transmitted from different television broadcasting stations. The intermediate-frequency signal outputted from the IF output terminal 9 is fed to a digital signal demodulation circuit (not illustrated) so as to be demodulated.

The reception signals fed to the RF input terminal 1 are each a radio-frequency carrier wave having superimposed thereon a signal obtained by modulating digital data by a modulation method such as OFDM, QAM, QPSK, 8VSB, or CDMA. As shown in FIG. 16, such a reception signal has an approximately constant level over largely the entire reception band, and thus exhibits a waveform without inclination.

However, the conventional digital tuner shown in FIG. 15 has the following drawbacks. Even when a reception signal having an approximately constant level over largely the entire reception band is fed to it, it cannot make approximately constant the level of the intermediate-frequency signal outputted from the IF output terminal. This is due to, in particular, variations in the filtering characteristics of the band-pass filters 2 and 4, and causes the outputted intermediate-frequency signal to have a waveform with an inclination as shown in FIG. 17. When the intermediate-frequency signal outputted from the IF output terminal has an inclined waveform, the digital signal demodulation circuit produces many errors, and in the worst case cannot output an image, sound, or data signal.

With the conventional digital tuner shown in FIG. 15, it is impossible to completely eliminate the waveform inclination of the intermediate-frequency signal, and it is only possible to alleviate it by reducing variations in the filtering characteristics through adjustment of the filtering characteristics of the band-pass filters 2 and 4.

Moreover, the conventional digital tuner shown in FIG. 15 is susceptible to signal deterioration within the reception band when interfered from outside the reception band.

SUMMARY OF THE INVENTION

A first object of the present invention is to provide a digital tuner that yields an output signal with a reduced waveform inclination.

In view of the problem discussed above, a second object of the present invention is to provide a digital tuner that suffers from less signal deterioration within the reception band even when interfered from outside the reception band.

To achieve the first object above, in one aspect of the present invention, a digital tuner is provided with: a filter section that selects a desired reception signal from inputted reception signals; a converter section that performs frequency conversion on the desired reception signal selected by the filter section; a level monitor section that monitors, with respect to a signal based on the signal outputted from the filter section, the signal levels thereof at two or more frequencies within the reception band; and a waveform shaper section that varies the waveform inclination of signals based on the inputted reception signals within the reception band according to the results of monitoring by the level monitor section.

With this configuration, the waveform inclination of the output signal can be corrected for automatically without reducing variations in the filtering characteristics of the filter section. This helps reduce the waveform inclination of the output signal.

To achieve the second object above, in another aspect of the present invention, a digital tuner is provided with: a filter section that selects a desired reception signal from inputted reception signals; a converter section that performs frequency conversion on the desired reception signal selected by the filter section; a level monitor section that monitors, with respect to a signal based on the signal outputted from the filter section, the signal levels thereof at two or more frequencies within the reception band; and a waveform shaper section that varies the waveform inclination of signals based on the inputted reception signals within the reception band according to the results of monitoring by the level monitor section. In addition, of the two or more frequencies within the reception band at which the level monitor section monitors the signal levels, one is located at a frequency outside the reception band at which interference occurs.

With this configuration, signal deterioration within the reception band resulting from interference from outside the reception band can be minimized. In particular, when a large signal is present in an adjacent channel (in an adjacent band), according to the signal level in that adjacent channel, the waveform shaper section intentionally attenuates the signal at the adjacent channel frequency so as to diminish the interfering signal.

By incorporating in a receiver apparatus a digital tuner configured like one of the digital tuners described above, it is possible to reduce demodulation errors and to reduce signal deterioration resulting from interference from outside the reception band.

By incorporating such a receiver apparatus in an electric appliance, it is possible to reduce errors that occur when an image, sound, or the like is outputted based on the reception signal.

DETAILED DESCRIPTION OF PREFERRED EMBODIMENTS

Figure 1:
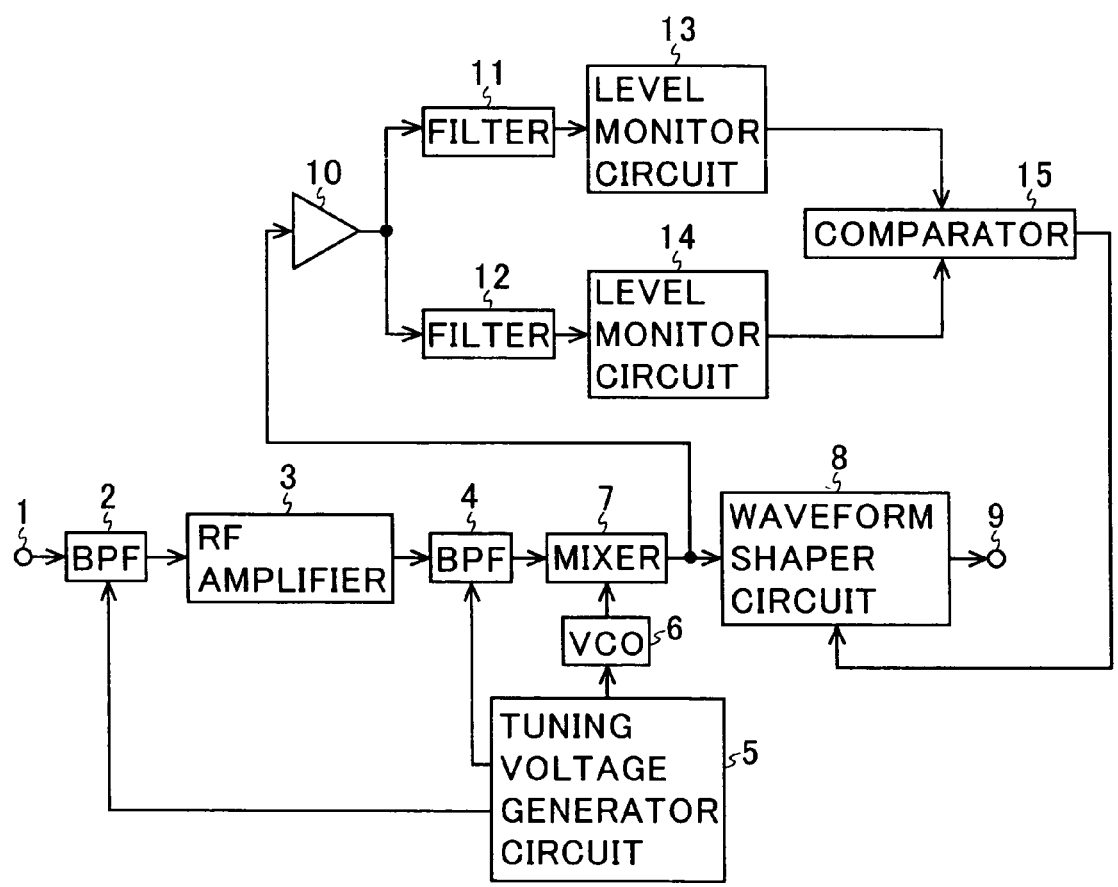
FIG. 1 is a diagram showing the configuration of the digital tuner of a first embodiment of the invention.

Hereinafter, embodiments of the present invention will be described with reference to the drawings. The following descriptions deal with, merely as examples of embodiments of the invention, digital tuners for receiving television broadcasts. First, a first embodiment of the invention will be described. The configuration of the digital tuner of the first embodiment of the invention is shown in FIG. 1. In FIG. 1, such components as are found also in FIG. 15 are identified with common reference numerals, and their detailed explanations will not be repeated.

Figure 15:
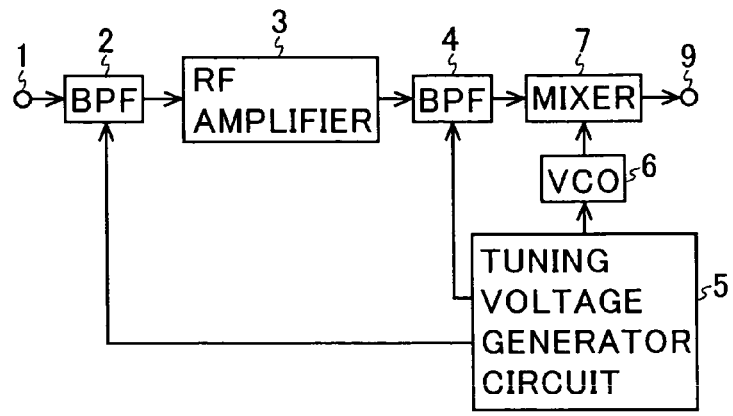
FIG. 15 is a diagram showing an example of the configuration of a conventional digital tuner.
Figure 16:
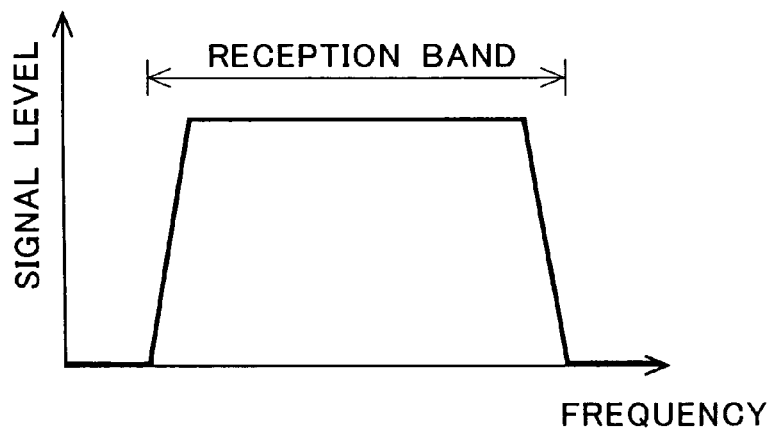
FIG. 16 is a diagram showing the spectrum of the input signal to the digital tuner of FIG. 15.
Figure 17:
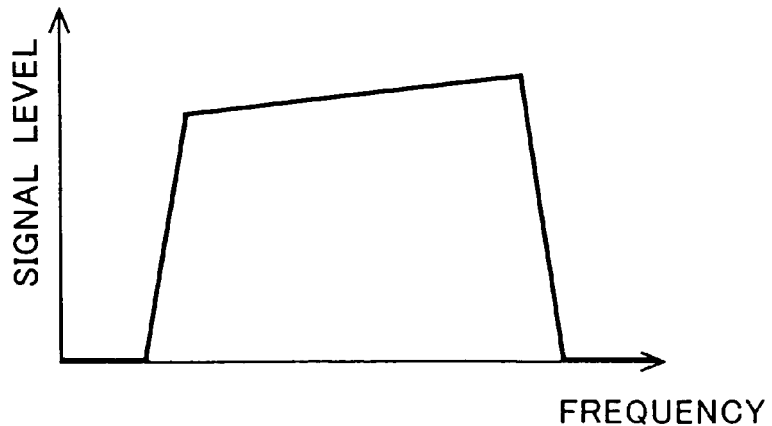
FIG. 17 is a diagram showing the spectrum of the output signal from the digital tuner of FIG. 15.

The digital tuner of the invention shown in FIG. 1, as compared with the conventional digital tuner shown in FIG. 15, is additionally provided with a waveform shaper circuit 8, a buffer circuit 10, filters 11 and 12, level monitor circuits 13 and 14, and a comparator 15.

The intermediate-frequency signal outputted from the mixer 7 is distributed between two paths, namely one via which the signal is fed to the buffer circuit 10 and the other via which the signal is fed to the waveform shaper circuit 8. The aim of providing the buffer circuit 10 here is to minimize the influence of the succeeding circuitry (including the filters 11 and 12, level monitor circuits 13 and 14, and comparator 15) on the intermediate-frequency signal outputted to the IF output terminal 9. The buffer circuit 10 may be replaced with a resistor attenuator, distribution coil, or small-capacitance capacitor that can reduce the influence of the succeeding circuitry (including the filters 11 and 12, level monitor circuits 13 and 14, and comparator 15) on the intermediate-frequency signal outputted to the IF output terminal 9. For cost reduction and out of other considerations, the buffer circuit 10 may be omitted altogether.

The intermediate-frequency signal outputted from the buffer circuit 10 is distributed between two paths. Via one path, the intermediate-frequency signal is fed to the filter 11. This filter 11 selects from the signal a predetermined frequency ($f_1$) component within the reception band. The signal level of the thus selected frequency ($f_1$) component is monitored by the level monitor circuit 13. Via the other path, the intermediate-frequency signal is fed to the filter 12, which has filtering characteristics different from those of the filter 11. This filter 12 selects from the signal a predetermined frequency ($f_2$) component within the reception band. The signal level of the thus selected frequency ($f_2$) component is monitored by the level monitor circuit 14. The level monitor circuits 13 and 14 respectively output voltages commensurate with the monitored signal levels to the comparator 15.

Figure 2A:
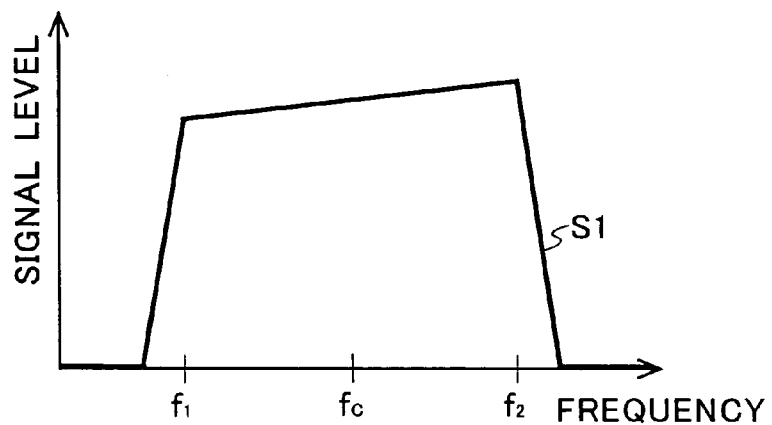
FIGS. 2A and 2B are diagrams showing the characteristics of the filters provided in the digital tuner of FIG. 1.
Figure 2B:
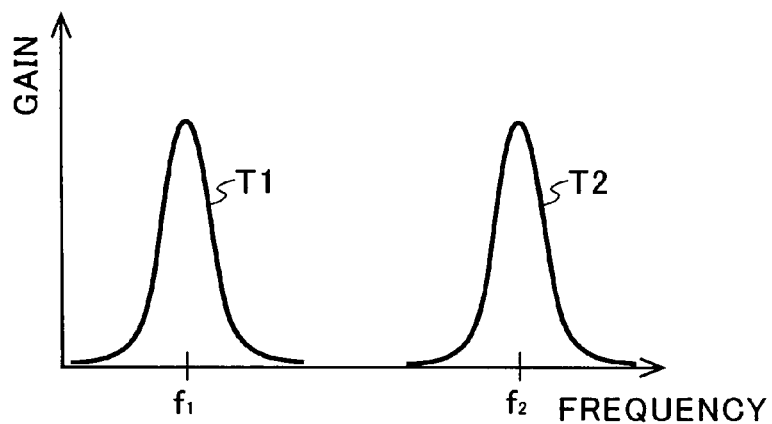

For example, suppose that the filters 11 and 12 are respectively given filtering characteristics as indicated by characteristic curves T1 and T2 shown in FIG. 2B. In this case, if the waveform inclination of the intermediate-frequency signal within the reception band is positive as indicated by an intermediate-frequency signal spectrum S1 shown in FIG. 2A, the level of the signal that is fed via the filter 11 to the level monitor circuit 13 is lower than the level of the signal that is fed via the filter 12 to the level monitor circuit 14. By contrast, if the waveform inclination of the intermediate-frequency signal within the reception band is negative, the level of the signal that is fed via the filter 11 to the level monitor circuit 13 is higher than the level of the signal that is fed via the filter 12 to the level monitor circuit 14.

The comparator 15 outputs to the waveform shaper circuit 8 a voltage commensurate with the difference between the output voltages of the level monitor circuits 13 and 14. Thus, the comparator 15 outputs a control voltage commensurate with the gradient of the waveform of the intermediate-frequency signal within the reception band.

Here, it is advisable to set as far apart as possible from each other the frequency ($f_1$) at which the level monitor circuit 13 monitors the signal level and the frequency ($f_2$) at which the level monitor circuit 14 monitors the signal level. The reason is that, the farther the frequencies at which the signal levels are monitored are apart from each other, the greater the difference between the signal levels is when the waveform of the intermediate-frequency signal within the reception band is inclined, and thus the higher the accuracy of the voltage outputted from the comparator 15 is. Accordingly, it is advisable that the filters 11 and 12 be respectively given filtering characteristics as indicated by the characteristic curves T1 and T2 shown in FIG. 2B so that the frequencies (f1 and f2) at which the signal levels are monitored are respectively higher and lower than the center frequency of the reception band for the intermediate-frequency signal by slightly smaller than half the band width of the reception band, that is, so that the signal levels are monitored at both ends of the reception band for the intermediate-frequency signal.

According to the control voltage outputted from the comparator 15, the waveform shaper circuit 8 performs waveform shaping on the waveform of the intermediate-frequency signal outputted from the mixer 7, and then feeds the signal to the IF output terminal 9.

Figure 3:
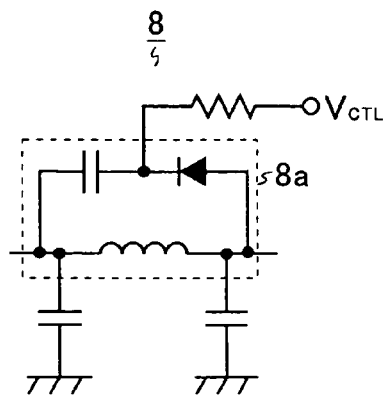
FIG. 3 is a diagram showing an example of the configuration of the waveform shaper circuit provided in the digital tuner of FIG. 1.

An example of the configuration of the waveform shaper circuit 8 is shown in FIG. 3. The waveform shaper circuit shown in FIG. 3 is provided with a variable-capacitance element. The control voltage $V_{CTL}$ outputted from the comparator 15 is applied, via a resistor, to the node between a capacitor and a variable-capacitance diode used as the variable-capacitance element. Thus, according to the control voltage $V_{CTL}$ outputted from the comparator 15, the capacitance of the variable-capacitance diode varies, and accordingly the filtering characteristics of a filter section 8a vary.

Figure 4A:
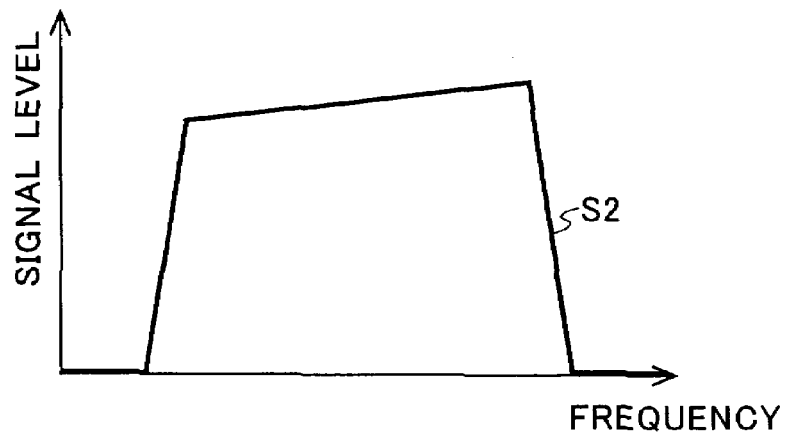
FIGS. 4A to 4C are diagrams showing the characteristics of the filter section included in the waveform shaper circuit of FIG. 3.
Figure 4B:
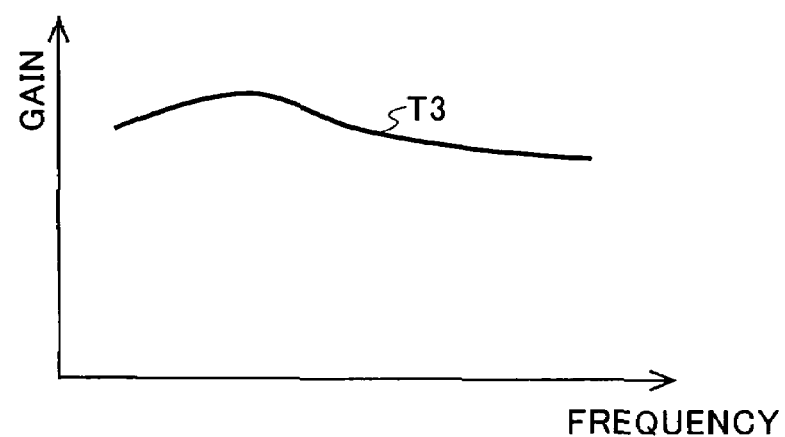
Figure 4C:
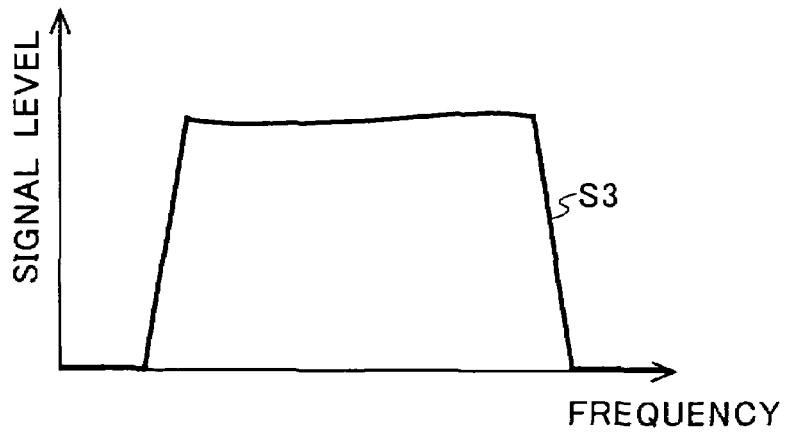

For example, suppose that the signal level drops in a lower-frequency part of the reception band for the intermediate-frequency signal as indicated by an intermediate-frequency signal spectrum S2 shown in FIG. 4A. In this case, by giving the waveform shaper circuit 8 filtering characteristics as indicated by a characteristic curve T3 shown in FIG. 4B so that its gain is higher in the lower-frequency part of the reception band, it is possible to make approximately constant the level of the intermediate-frequency signal outputted from the IF output terminal 9 over largely the entire reception band, as indicated by an intermediate-frequency signal spectrum S3 shown in FIG. 4C. Here, by appropriately setting the control voltage $V_{CTL}$ outputted from the comparator 15 and the filtering characteristics of the waveform shaper circuit 8, it is possible to correct the waveform of the intermediate-frequency signal automatically even when the waveform varies because of variations in the filtering characteristics of the band-pass filters 2 and 4 or for other causes. In this way, it is possible to correct for the waveform inclination of the intermediate-frequency signal automatically without reducing variations in the filtering characteristics through adjustment of the filtering characteristics of the band-pass filters 2 and 4.

Figure 5:
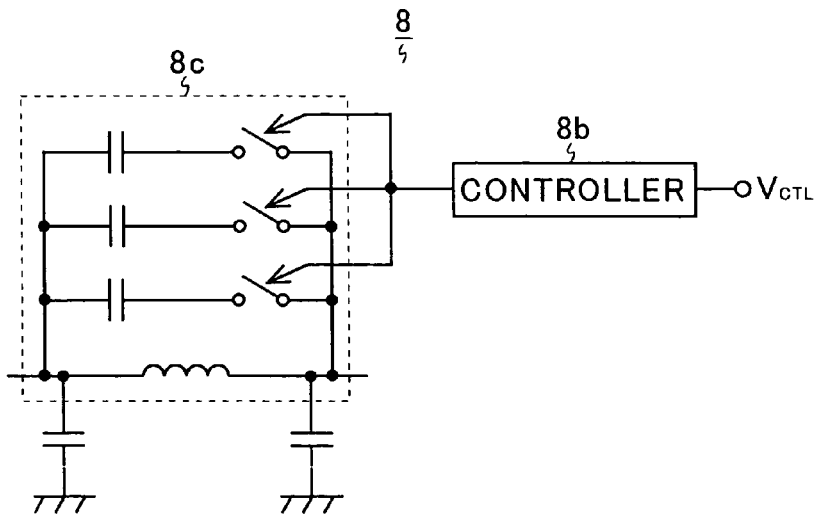
FIG. 5 is a diagram showing another example of the configuration of the waveform shaper circuit provided in the digital tuner of FIG. 1.
Figure 6:
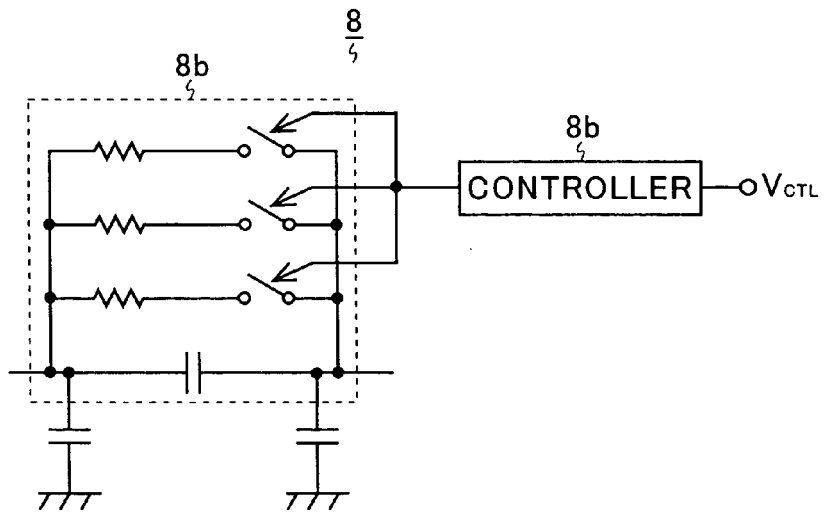
FIG. 6 is a diagram showing another example of the configuration of the waveform shaper circuit provided in the digital tuner of FIG. 1.
Figure 7:
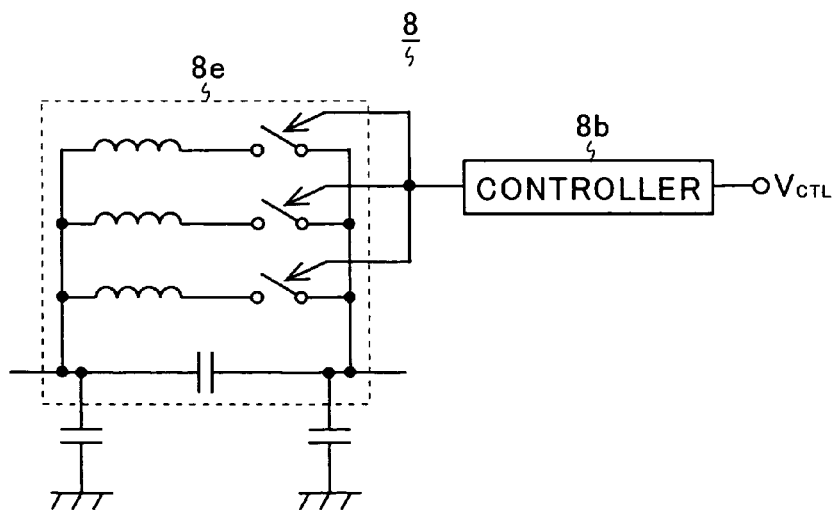
FIG. 7 is a diagram showing another example of the configuration of the waveform shaper circuit provided in the digital tuner of FIG. 1.

The waveform shaper circuit shown in FIG. 3 has a simple circuit configuration, and is therefor suitable for cost reduction. However, in an IC, it is in general more difficult to build a variable-capacitance element than to switch a plurality of elements. Accordingly, in a case where the waveform shaper circuit 8 is built in an IC, it is advisable to adopt a circuit configuration like, for example, one of those shown in FIGS. 5 to 7. FIGS. 5 to 7 show different examples of the circuit configuration in which interconnection of a plurality of capacitive elements, a plurality of resistive elements, and a plurality of inductors, respectively, is switched by the use of switches. In any of these waveform shaper circuits, a controller 8b turns on and off the switches according to the control voltage $V_{CTL}$ outputted from the comparator 15 so that, as the control voltage $V_{CTL}$ outputted from the comparator 15 varies, the filtering characteristics of a filter section 8c, 8d, or 8e vary. In FIGS. 5 to 7, the individual elements are connected in parallel with one another and their interconnection is switched by the use of switches. Needless to say, these elements may be connected in series with one another, or may be connected in a combined pattern of series and parallel connection.

In the digital tuner of FIG. 1, the waveform shaper circuit 8 is provided between the mixer 7 and the IF output terminal 9. Considering, however, that what is essential here is to ultimately perform waveform shaping on the intermediate-frequency signal outputted from the IF output terminal 9 according to the control voltage outputted from the comparator 15, the waveform shaper circuit 8 may be provided anywhere in the signal line leading from the RF input terminal 1 to the IF output terminal 9. Thus, the waveform shaper circuit 8 may be provided either in a stage preceding or succeeding the RF amplifier 3, though this necessitates modifications in circuit constants. The comparator 15 may be so configured as to output a pulse signal or sine-wave signal having a frequency commensurate with the difference between the output voltages of the level monitor circuits 13 and 14, or digital control data commensurate with the difference between the output voltages of the level monitor circuits 13 and 14.

The digital tuner of FIG. 1 is provided with the filters 11 and 12. This is because, for cost reduction, the level monitor circuits 13 and 14 are configured as circuits having no capability of selecting a frequency and, to make up for the lack of such a capability, the filters 11 and 12 having different filtering characteristics are provided. In a case where the level monitor circuits 13 and 14 are configured as circuits having a capability of selecting a frequency, there is no need to provide the filters 11 and 12.

In the present invention, what is important is to compare, with respect to the signal that travels along the signal line leading from the RF input terminal 1 to the IF output terminal 9, the signal levels thereof at different frequencies within the reception band. Accordingly, the filters 11 and 12 may be built as simple LC filters (filters composed of inductors and capacitors), or as filter elements such as ceramic filters, or as active filters employing semiconductor devices. Even in a case where the filters 11 and 12 are provided, for higher accuracy in signal level monitoring, the level monitor circuits 13 and 14 may be given a capability of selecting a frequency.

In the embodiment described above, the filters 11 and 12 both select a predetermined frequency component within the reception band for the intermediate-frequency signal. Alternatively, the following configuration is also possible. Of the two filters, one selects a predetermined frequency component within the reception band for the signal (for example, the intermediate-frequency signal) that travels along the signal line leading from the RF input terminal 1 to the IF output terminal 9, while the other selects a channel frequency component that causes interference, such as adjacent-channel interference, from outside the reception band for the signal (for example, the intermediate-frequency signal) that travels along the signal line leading from the RF input terminal 1 to the IF output terminal 9. In this case, the comparator 15 compares the signal level at the reception frequency with that at the channel frequency at which interference, such as adjacent-channel interference, from outside the reception band occurs, and then varies the waveform of the signal (for example, the intermediate-frequency signal) that travels along the signal line leading from the RF input terminal 1 to the IF output terminal 9. In this way, it is possible to minimize signal deterioration within the reception band resulting from interference from outside the reception band. In particular, when a large signal is present in an adjacent channel (in an adjacent band), according to the signal level in that adjacent channel, the waveform shaper circuit 8 intentionally attenuates the signal at the adjacent channel frequency so as to diminish the interfering signal.

Figure 8:
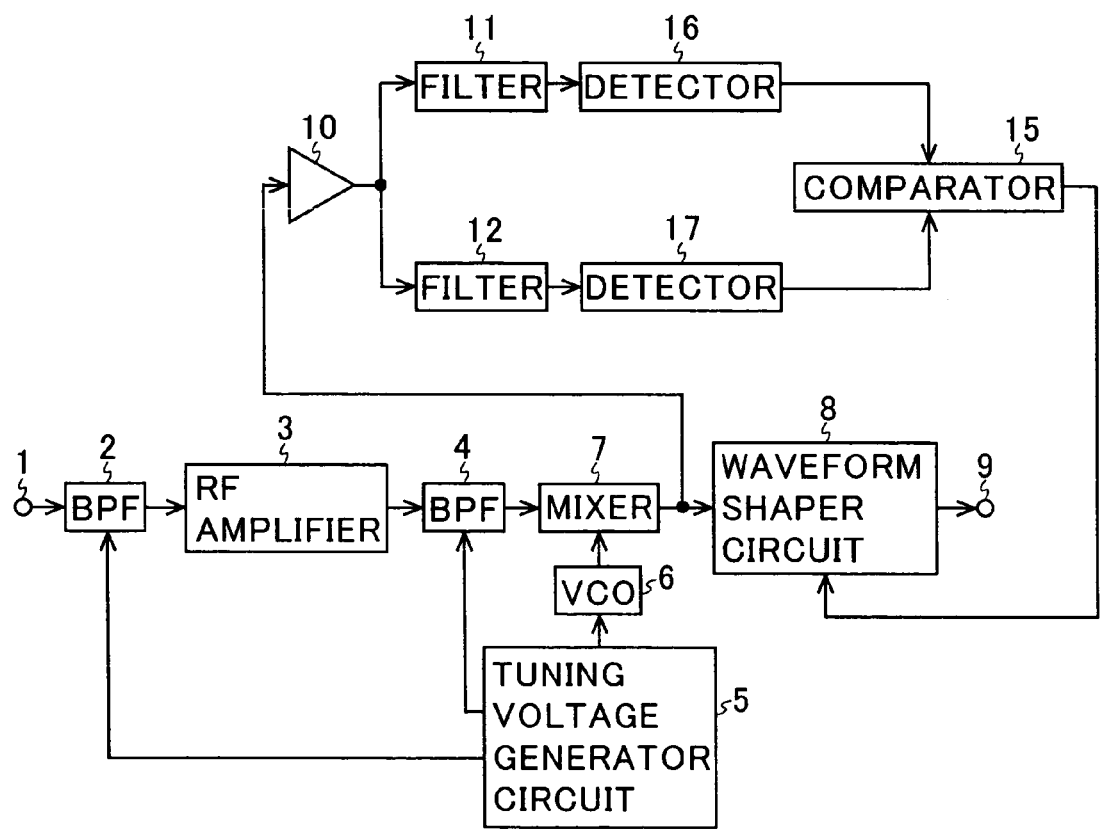
FIG. 8 is a diagram showing the configuration of the digital tuner of a second embodiment of the invention.
Figure 9:
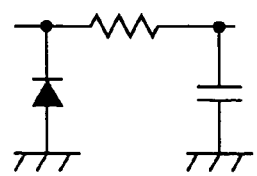
FIG. 9 is a diagram showing an example of the configuration of the detectors provided in the digital tuner of FIG. 8.

Next, a second embodiment of the invention will be described. The configuration of the digital tuner of the second embodiment of the invention is shown in FIG. 8. In FIG. 8, such components as are found also in FIG. 1 are identified with common reference numerals, and their detailed explanations will not be repeated. In the digital tuner of FIG. 8, the level monitor circuits 13 and 14 used in the digital tuner of FIG. 1 are respectively replaced with detectors 16 and 17. That is, here, instead of level monitor circuits, which have a complicated circuit configuration, detectors, which have a simple circuit configuration, are used. This contributes to miniaturization and cost reduction. A typical example of the configuration of the detectors is shown in FIG. 9. The detector shown in FIG. 9 has a simple circuit configuration composed of one diode, one resistor, and one capacitor, and is built as a circuit that converts a radio-frequency signal into a direct-current voltage. In the present invention, what is important is to compare, with respect to the signal that travels along the signal line leading from the RF input terminal 1 to the IF output terminal 9, the signal levels thereof at different frequencies within the reception band. This can be achieved by the use of, instead of level monitor circuits, which have a complicated circuit configuration, detectors, which have a simple circuit configuration as shown in FIG. 9. With the digital tuner of FIG. 8, as with the digital tuner of FIG. 1, it is possible, without reducing variations in the filtering characteristics through adjustment of the filtering characteristics of the band-pass filters 2 and 4, to automatically correct for the waveform inclination of the intermediate-frequency signal outputted from the IF output terminal 9.

Figure 10:
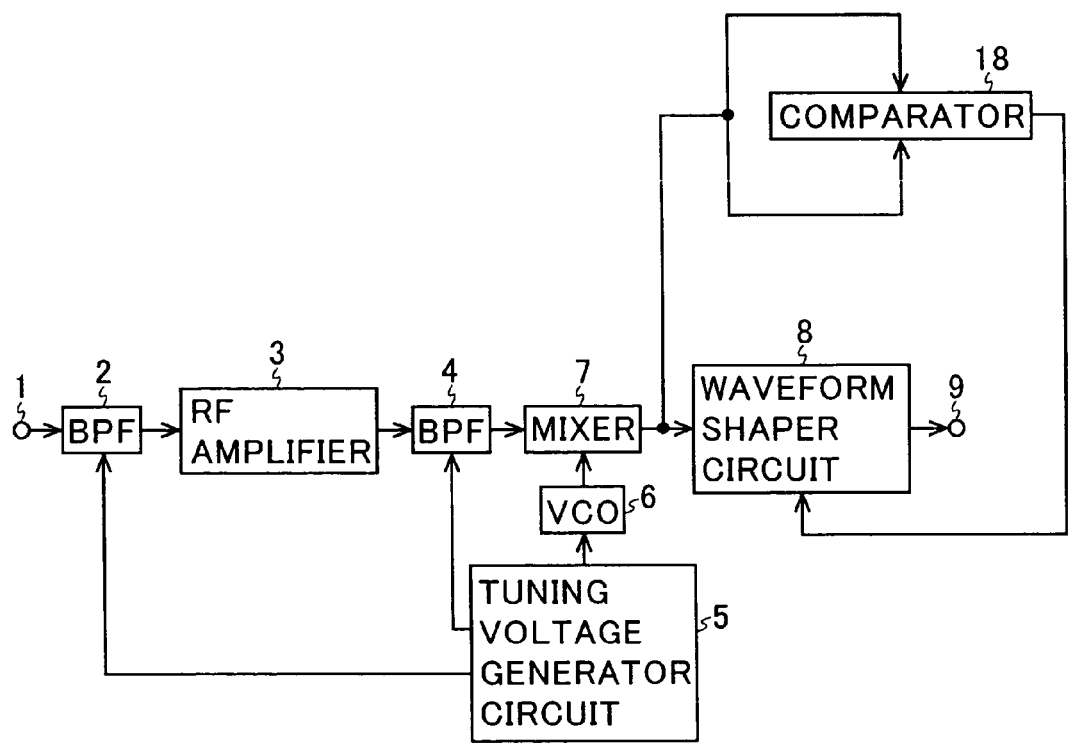
FIG. 10 is a diagram showing the configuration of the digital tuner of a third embodiment of the invention.

Next, a third embodiment of the invention will be described. The configuration of the digital tuner of the third embodiment of the invention is shown in FIG. 10. In FIG. 10, such components as are found also in FIG. 1 are identified with common reference numerals, and their detailed explanations will not be repeated. In the digital tuner of FIG. 10, as compared with the digital tuner of FIG. 1, the buffer circuit 10 is omitted, and the succeeding circuitry (including the filters 11 and 12, level monitor circuits 13 and 14, and comparator 15) is replaced with a comparator 18. The comparator 18 has a capability of selecting a frequency. The intermediate-frequency signal distributed between two paths is fed, via both the paths, to the comparator 18. The comparator 18 selects a predetermined frequency ($f_1$) component from the signal fed via one path thereto, and selects a predetermined frequency ($f_2$) component from the signal fed via the other path thereto. The comparator 18 then outputs a voltage commensurate with the level difference between the two signals selected as the two different frequency components. With the digital tuner of FIG. 10, as with the digital tuners of FIGS. 1 and 8, it is possible, without reducing variations in the filtering characteristics through adjustment of the filtering characteristics of the band-pass filters 2 and 4, to automatically correct for the waveform inclination of the intermediate-frequency signal outputted from the IF output terminal 9.

Figure 11:
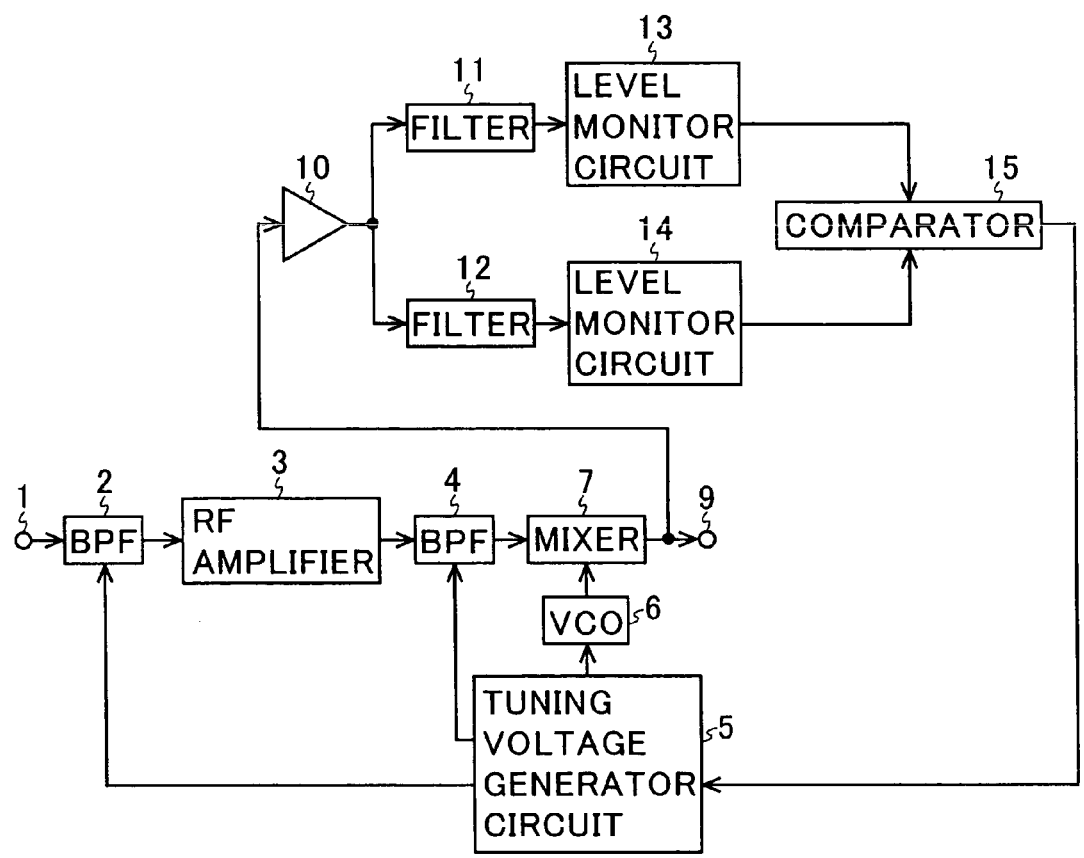
FIG. 11 is a diagram showing the configuration of the digital tuner of a fourth embodiment of the invention.

Next, a fourth embodiment of the invention will be described. The configuration of the digital tuner of the fourth embodiment of the invention is shown in FIG. 11. In FIG. 11, such components as are found also in FIG. 1 are identified with common reference numerals, and their detailed explanations will not be repeated.

In the digital tuner of FIG. 11, as compared with the digital tuner of FIG. 1, the waveform shaper circuit 8 is omitted, and the control voltage outputted from the comparator 15 is superimposed on the tuning voltage fed from the tuning voltage generator circuit 5 to the band-pass filters 2 and 4. The simplest way to achieve this superimposition is as follows. The line to which the comparator 15 outputs the control voltage is connected through a resistor having a resistance of about 1 MΩ to the line via which the tuning voltage is fed from the tuning voltage generator circuit 5 to the band-pass filter 2; moreover, the line to which the comparator 15 outputs the control voltage is connected through a resistor having a resistance of about 1 MΩ to the line via which the tuning voltage is fed from the tuning voltage generator circuit 5 to the band-pass filter 4. Here, for the purpose of isolating the comparator 15 from the band-pass filters 2 and 4 and the tuning voltage generator circuit 5, the line to which the comparator 15 outputs the control voltage may be connected via a buffer circuit or the like to the lines via which the tuning voltage is fed from the tuning voltage generator circuit 5 to the band-pass filters.

The band-pass filters 2 and 4 have a capability of varying the filtering characteristics thereof according to the tuning voltage outputted from the tuning voltage generator circuit 5. On the other hand, in the digital tuner of FIG. 1, the waveform shaper circuit 8 has a capability of varying the filtering characteristics of the filter section provided therein according to the control voltage $V_{CTL}$ outputted from the comparator 15.

Thus, the band-pass filters 2 and 4, on one hand, and the waveform shaper circuit 8, on the other, both have a capability of varying filtering characteristics. Accordingly, in the digital tuner shown in FIG. 11, by superimposing the control voltage outputted from the comparator 15 on the tuning voltage fed from the tuning voltage generator circuit 5 to the band-pass filters 2 and 4, the band-pass filters 2 and 4 are given both a capability of selecting the desired reception signal and a capability of shaping the waveform.

Next, a fifth embodiment of the invention will be described. So long as the frequency of the intermediate-frequency signal is constant as is usually the case, configuring digital tuners as in the first to fourth embodiments described above poses any particular inconveniences. However, the frequency of the intermediate-frequency signal for the reception of television broadcasts varies from one country or geographic area to another. Accordingly, when a digital tuner is designed for use worldwide, or for other reasons, it may be necessary to cope with a plurality of intermediate-frequency signals having different frequencies. Also in a case where a digital tuner is built in an IC, to make it as compatible as possible, it may be necessary to cope with a plurality of intermediate-frequency signals having different frequencies. In view of this, the digital tuner of the fifth embodiment of the invention is so configured that it can cope with a plurality of intermediate-frequency signals having different frequencies. The configuration of the digital tuner of the fifth embodiment of the invention is shown in FIG. 12.

Figure 12:
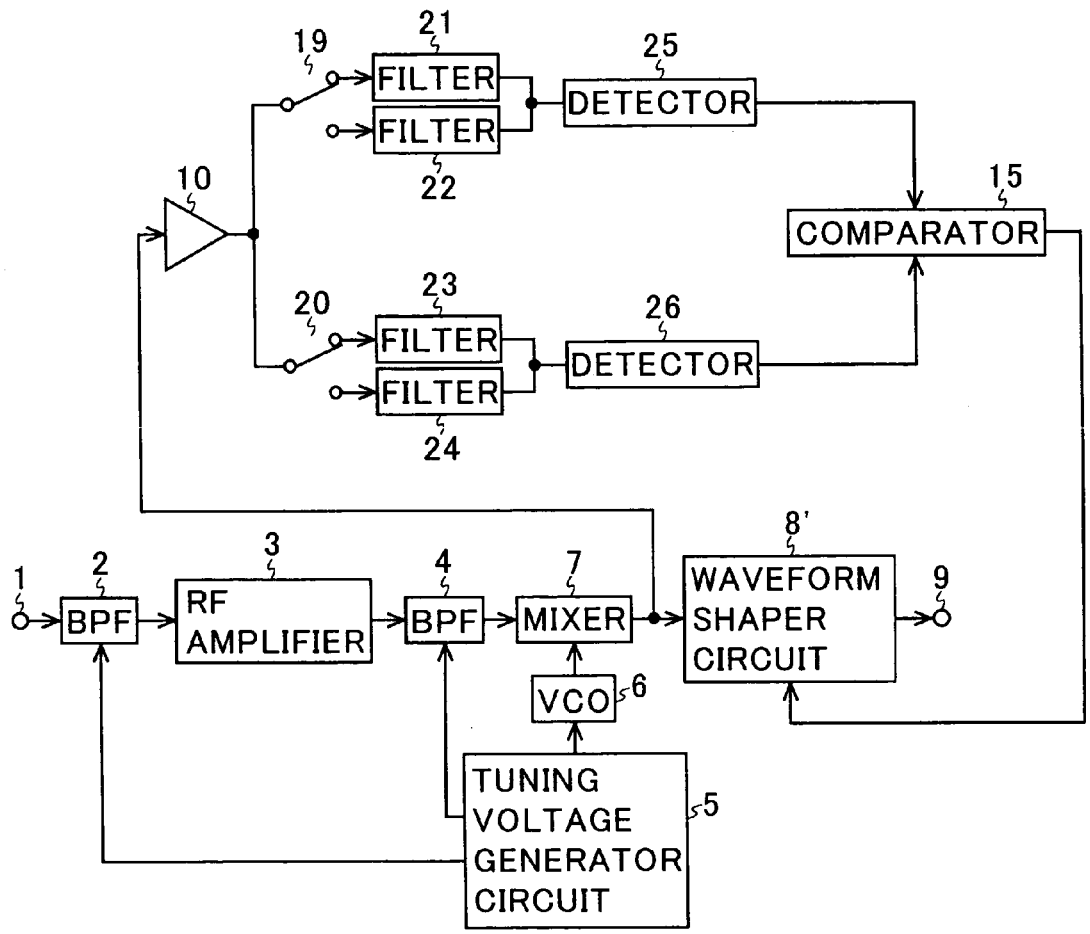
FIG. 12 is a diagram showing the configuration of the digital tuner of a fifth embodiment of the invention.

In FIG. 12, such components as are found also in FIG. 1 are identified with common reference numerals, and their detailed explanations will not be repeated.

The intermediate-frequency signal outputted from the buffer circuit 10 is distributed between two paths. Via one path, the intermediate-frequency signal is fed via a switch 19 to a filter 21 or 22, where the signal is subjected to selection, and then to a detector 25, where the signal is converted into a direct-current voltage; via the other path, the intermediate-frequency signal is fed via a switch 20 to a filter 23 or 24, where the signal is subjected to selection, and then to a detector 26, where the signal is converted into a direct-current voltage. The comparator 15 then outputs to a waveform shaper circuit 8' a control voltage commensurate with the difference between the output voltages of the detectors 25 and 26.

The filters 21 and 23 respectively select a predetermined frequency component ($f_3$) and a predetermined frequency component ($f_4$) within the reception band for an intermediate-frequency signal having a predetermined frequency ($F_1$). The filters 22 and 24 respectively select a predetermined frequency component ($f_5$) and a predetermined frequency component ($f_6$) within the reception band for an intermediate-frequency signal having a predetermined frequency ($F_2$). When the intermediate-frequency signal having the predetermined frequency ($F_1$) is outputted from the IF output terminal 9, the switch 19 selects the filter 21, and the switch 20 selects the filter 23; when the intermediate-frequency signal having the predetermined frequency ($F_2$) is outputted from the IF output terminal 9, the switch 19 selects the filter 22, and the switch 20 selects the filter 24.

In the digital tuner of FIG. 12, the frequencies at which the signal levels are monitored are varied by switching filters by the use of switches. Alternatively, it is also possible to replace the switch 19 and the filters 21 and 22 with a filter that is capable of varying the filtering characteristics thereof, and to replace the switch 20 and the filters 23 and 24 with a filter that is capable of varying the filtering characteristics thereof. Alternatively, it is also possible to replace the switch 19, the filters 21 and 22, and the detector 25 with a level monitor circuit having a capability of selecting a frequency, to replace the switch 20, the filters 23 and 24, and the detector 26 with a level monitor circuit having a capability of selecting a frequency, and to make the level monitor circuits switch selected frequencies. Alternatively, it is also possible to omit the switch 19, the filters 21 and 22, and the detector 25, to omit the switch 20, the filters 23 and 24, and the detector 26, to replace the comparator 15 with a comparator having a capability of selecting a frequency, and to make this comparator switch selected frequencies.

Figure 13:
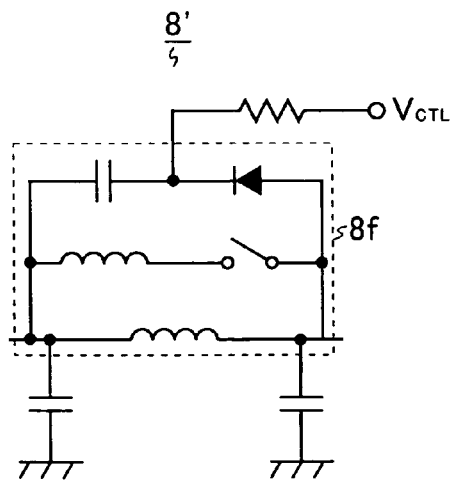
FIG. 13 is a diagram showing an example of the configuration of the waveform shaper circuit provided in the digital tuner of FIG. 12.

The waveform shaper circuit 8' is so configured that it can vary the filtering characteristics of a filter section even when there is no change in the control voltage outputted from the comparator 15. An example of the configuration of the waveform shaper circuit 8' is shown in FIG. 13. The waveform shaper circuit of FIG. 13, as compared with the waveform shaper circuit of FIG. 3, is additionally provided with a switch and an inductor that are connected in series with each other. By turning this switch on and off, even when there is no change in the control voltage outputted from the comparator 15, it is possible to vary the filtering characteristics of the filter section 8f. This permits the waveform shaper circuit to be kept optimal in accordance with changes in the frequency of the intermediate-frequency signal. In the waveform shaper circuit shown in FIG. 13, by turning the switch on and off, interconnection of inductors is switched. Alternatively, by turning the switch on and off, interconnection of capacitors may be switched. What is important here is to configure the waveform shaper circuit 8' such that it can vary the filtering characteristics of the filter section even when there is no change in the control voltage outputted from the comparator 15. Accordingly, so long as the waveform shaper circuit 8' is given this capability, it may be configured in any manner other than shown in FIG. 13.

Figure 14:
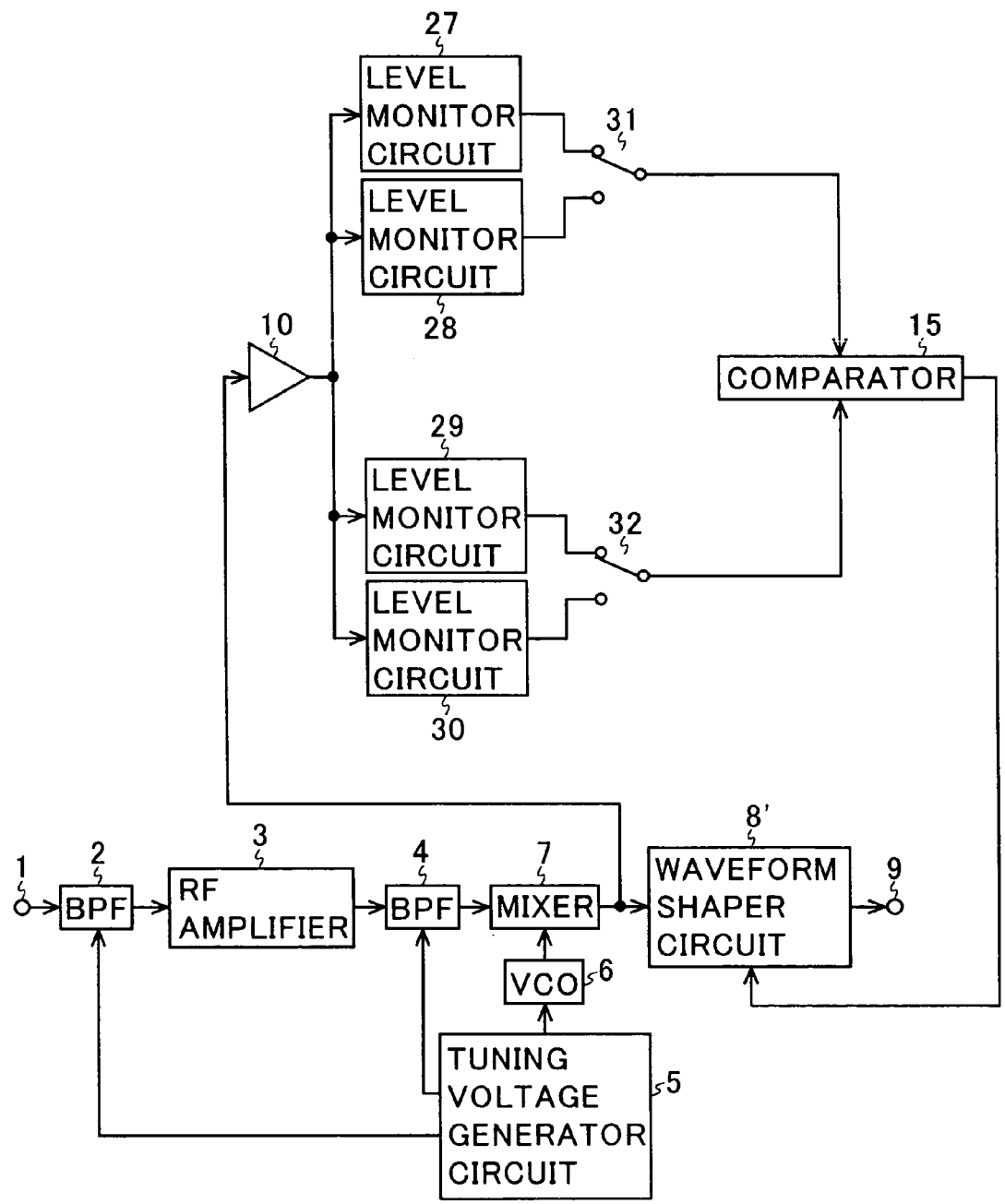
FIG. 14 is a diagram showing the configuration of the digital tuner of a sixth embodiment of the invention.

Next, a sixth embodiment of the invention will be described. The digital tuner of the sixth embodiment of the invention, like the digital tuner of FIG. 12 described above, is so configured that it can cope with a plurality of intermediate-frequency signals having different frequencies. The configuration of the digital tuner of the sixth embodiment of the invention is shown in FIG. 14. In FIG. 14, such components as are found also in FIG. 12 are identified with common reference numerals, and their detailed explanations will not be repeated.

The intermediate-frequency signal outputted from the buffer circuit 10 is distributed among four path so as to be fed, respectively via the four paths, to level monitor circuits 27 to 30 each having a capability of selecting a frequency. One of the output voltage of the level monitor circuit 27 or that of the level monitor circuit 28 is selected by a switch 31, and is then fed to the comparator 15. Likewise, one of the output voltage of the level monitor circuit 29 or that of the level monitor circuit 30 is selected by a switch 32, and is then fed to the comparator 15.

The level monitor circuits 27 and 29 respectively select a predetermined frequency component ($f_3$) and a predetermined frequency component ($f_4$) within the reception band for an intermediate-frequency signal having a predetermined frequency ($F_1$). The level monitor circuits 28 and 30 respectively select a predetermined frequency component ($f_5$) and a predetermined frequency component ($f_6$) within the reception band for an intermediate-frequency signal having a predetermined frequency ($F_2$). When the intermediate-frequency signal having the predetermined frequency ($F_1$) is outputted from the IF output terminal 9, the switch 31 selects the level monitor circuit 27, and the switch 32 selects the level monitor circuit 29; when the intermediate-frequency signal having the predetermined frequency ($F_2$) is outputted from the IF output terminal 9, the switch 31 selects the level monitor circuit 28, and the switch 32 selects the level monitor circuit 30.

The fifth and sixth embodiments described above deal with digital tuners that can cope with two intermediate-frequency signals having different frequencies. Needless to say, by increasing the number of switches and the number of filters or level monitor circuits selected by those switches, it is possible to realize digital tuners that can cope with three or more intermediate-frequency signals having different frequencies.

By applying a digital tuner according to the present invention to a receiver apparatus provided with a digital tuner and a signal demodulator circuit for demodulating the output signal of the digital tuner, it is possible to realize a receiver apparatus that produces less demodulation errors. By applying a digital tuner according to the present invention to a receiver apparatus provided with a digital tuner and a signal demodulator circuit for demodulating the output signal of the digital tuner, it is possible to realize a receiver apparatus that suffers from less signal deterioration resulting from interference from outside the reception band.

Moreover, by applying a digital tuner according to the present invention to an electric appliance (for example, a television receiver or a cellular phone) provided with a receiver apparatus that incorporates a digital tuner and an output device that outputs an image, sound, or the like according to the output signal of the receiver apparatus, it is possible to realize an electric appliance that produces less errors when an image, sound, or the like is outputted.

What is claimed is:

1. A digital tuner comprising:
    a filter section that selects a desired reception signal from inputted reception signals;
    a converter section that performs frequency conversion on the desired reception signal selected by the filter section;
    a level monitor section that monitors, with respect to a signal based on a signal outputted from the filter section, signal levels thereof at two or more frequencies within a reception band;
    a waveform shaper section that varies a waveform inclination of signals based on the inputted reception signals within the reception band according to results of monitoring by the level monitor section.

2. The digital tuner of claim 1,
    wherein the level monitor section comprises:
        a plurality of filters that respectively select signals of different frequencies;
        a plurality of level monitor circuits that respectively monitor signal levels of signals outputted from the plurality of filters; and
        a comparator that compares monitoring results of the plurality of level monitor circuits.

3. The digital tuner of claim 1,
    wherein the level monitor section comprises:
        a plurality of level monitor circuits; and
        a comparator that compares monitoring results of the plurality of level monitor circuits,
    wherein the plurality of level monitor circuits each have a capability of selecting a frequency so that the plurality of level monitor circuits monitor signal levels at different frequencies.

4. The digital tuner of claim 1,
    wherein the level monitor section comprises:
        a plurality of filters that respectively select signals of different frequencies;
        a plurality of detector circuits that respectively detect signals outputted from the plurality of filters; and
        a comparator that compares detection results of the plurality of detector circuits.

5. The digital tuner of claim 1,
    wherein the level monitor section comprises:
        a plurality of detector circuits; and
        a comparator that compares detection results of the plurality of detector circuits, and
    wherein the plurality of detector circuits each have a capability of selecting a frequency so that the plurality of detector circuits detect signals at different frequencies.

6. The digital tuner of claim 1,
    wherein the level monitor section is a comparator having a capability of selecting a frequency, and the comparator compares signal levels at two or more frequencies.

7. The digital tuner of claim 1,
    wherein a buffer circuit is provided in a stage preceding to the level monitor section.

8. The digital tuner of claim 1,
    wherein, of the two or more frequencies within the reception band at which the level monitor section monitors the signal levels, two are frequencies that are respectively higher and lower than a center frequency of the reception band by slightly smaller than half a band width of the reception band.

9. The digital tuner of claim 1,
    wherein, of the two or more frequencies within the reception band at which the level monitor section monitors the signal levels, one is located at a frequency outside the reception band at which interference occurs.

10. The digital tuner of claim 1,
    wherein the waveform shaper section includes a filter circuit having a variable-capacitance element whose capacitance varies according to the results of monitoring by the level monitor section.

11. The digital tuner of claim 1,
    wherein the waveform shaper section includes a filter circuit having a plurality of capacitive elements, a plurality of resistive elements, and/or a plurality of inductors whose interconnection is switched according to the results of monitoring by the level monitor section.

12. The digital tuner of claim 1,
    wherein the filter section and the waveform shaper section are built with an identical filter circuit.

13. The digital tuner of claim 1,
    wherein the two or more frequencies within the reception band at which the level monitor section monitors the signal levels are variable.

14. The digital tuner of claim 13,
    wherein the waveform shaper section can vary waveform shaping characteristics thereof even when there is no change in the results of monitoring by the level monitor section.

15. A receiver apparatus comprising:
    a digital tuner; and
    a digital demodulator circuit that demodulates an output signal of the digital tuner,
    wherein the digital tuner comprises:
        a filter section that selects a desired reception signal from inputted reception signals;
        a converter section that performs frequency conversion on the desired reception signal selected by the filter section;
        a level monitor section that monitors, with respect to a signal based on a signal outputted from the filter section, signal levels thereof at two or more frequencies within a reception band;
        a waveform shaper section that varies a waveform inclination of signals based on the inputted reception signals within the reception band according to results of monitoring by the level monitor section.

16. The receiver apparatus of claim 15,
    wherein, of the two or more frequencies within the reception band at which the level monitor section monitors the signal levels, one is located at a frequency outside the reception band at which interference occurs.

17. An electric appliance comprising:
    a digital tuner;
    a digital demodulator circuit that demodulates an output signal of the digital tuner; and
    an output device that yields an output based on an output signal of the digital demodulator circuit,
    wherein the digital tuner comprises:
        a filter section that selects a desired reception signal from inputted reception signals;
        a converter section that performs frequency conversion on the desired reception signal selected by the filter section;

a level monitor section that monitors, with respect to a signal based on a signal outputted from the filter section, signal levels thereof at two or more frequencies within a reception band;

a waveform shaper section that varies a waveform inclination of signals based on the inputted reception signals within the reception band according to results of monitoring by the level monitor section.

18. The electric appliance of claim 17, wherein, of the two or more frequencies within the reception band at which the level monitor section monitors the signal levels, one is located at a frequency outside the reception band at which interference occurs.

* * * * *